United States Patent

Zejda

[11] Patent Number: 5,503,675
[45] Date of Patent: *Apr. 2, 1996

[54] APPARATUS FOR APPLYING A MASK TO AND/OR REMOVING IT FROM A SUBSTRATE

[75] Inventor: Jaroslav Zejda, Rodenbach, Germany

[73] Assignee: Leybold Aktiengesellschaft, Hanau, Germany

[*] Notice: The term of this patent shall not extend beyond the expiration date of Pat. No. 5,354,380.

[21] Appl. No.: 163,854

[22] Filed: Dec. 7, 1993

[30] Foreign Application Priority Data

Feb. 2, 1993 [DE] Germany .......................... 43 02 851.9

[51] Int. Cl.⁶ ............................................... C23C 14/00
[52] U.S. Cl. ........................... 118/719; 118/721; 118/505; 204/298.11; 204/298.25; 414/217
[58] Field of Search .................... 118/720, 721, 118/730, 719, 500, 504, 505; 204/298.11, 298.25, 298.27, 298.28; 414/217, 222, 223, 225

[56] References Cited

U.S. PATENT DOCUMENTS

| | | | |
|---|---|---|---|
| 3,838,028 | 9/1974 | Needham et al. | 204/298.25 |
| 3,915,117 | 10/1975 | Schertler | 118/719 |
| 4,548,699 | 10/1985 | Hutchinson et al. | 204/298.25 |
| 4,735,540 | 4/1988 | Allen et al. | 204/298.25 |
| 4,745,878 | 5/1988 | Sagawa | 204/298.11 |
| 4,886,592 | 12/1989 | Anderle | 118/721 |
| 4,938,858 | 7/1990 | Zejda | 204/298.25 |
| 4,943,363 | 7/1990 | Zejda et al. | 414/222 |
| 5,112,469 | 5/1992 | Kempf et al. | 118/719 |
| 5,354,380 | 10/1994 | Zejda | 118/719 |

FOREIGN PATENT DOCUMENTS

| | | |
|---|---|---|
| 0220685 | 5/1987 | European Pat. Off. . |
| 3604698 | 8/1987 | Germany . |

*Primary Examiner*—R. Bruce Breneman
*Assistant Examiner*—Rodney G. McDonald
*Attorney, Agent, or Firm*—Felfe & Lynch

[57] ABSTRACT

First and second transport chambers are joined to one another through a common opening (5), and house respective substrate carriers (6, 7) mounted for rotation about parallel axes. In at least one position the carriers may be superposed, plungers (14 and 15) being disposed in the area of this superposition on opposite sides of the carriers, both carriers being longitudinally displaceable parallel to the pivot axes (a and b, respectively). After a coating operation in the second transport chamber, the second plunger releases the mask from the second carrier, moves it back to the first carrier where the substrate is peripherally engaged, then moves the mask still further in order to release it from the substrate. The second plunger then retreats, and the coated substrate can be rotated in the first chamber.

8 Claims, 1 Drawing Sheet

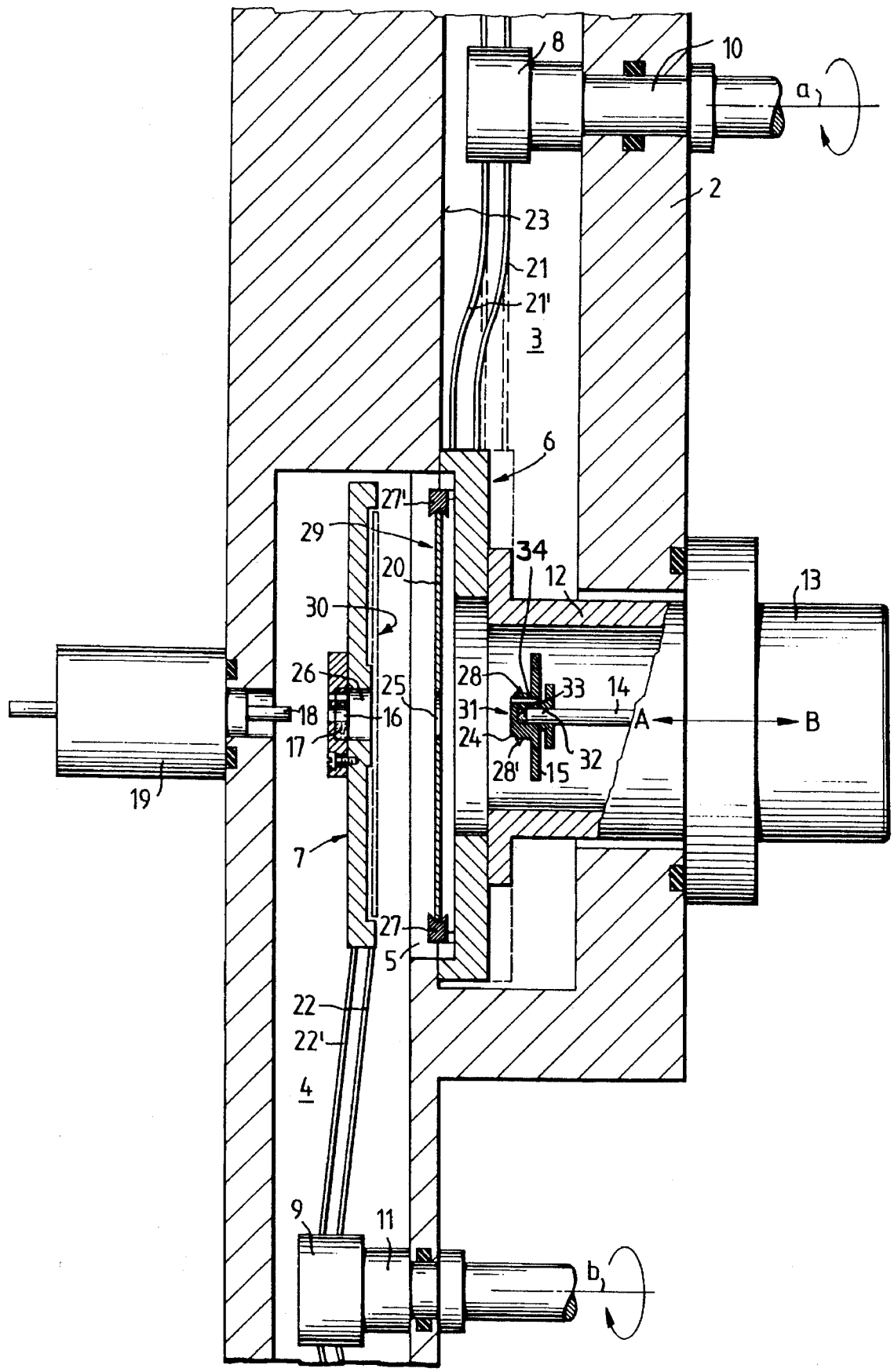

APPARATUS FOR APPLYING A MASK TO AND/OR REMOVING IT FROM A SUBSTRATE

BACKGROUND OF THE INVENTION

The invention relates to an apparatus for applying a mask to and/or removing a mask from a preferably ring-shaped, flat substrate in a vacuum coating apparatus having two transport chambers arranged in planes parallel to one another which are connected to one another by a common opening.

An apparatus for coating flat substrates, compact disks for example, is known (U.S. Pat. No. 4,548,699) having a shallow cylindrical transport chamber and a circular disk-shaped substrate holder rotatably mounted in this transport chamber, which transports the substrate, after it is inserted through an airlock into the transport chamber, from the one treatment station to the next treatment station. The disk-shaped substrate holder is displaceable by a motor on the shaft on which it is rotatably mounted, also in the direction of the axis of rotation, so that the substrates disposed on the substrate plate are not only transportable on a circular path from station to station, but also can be moved to a point directly in front of the treatment station and to a point in front of the insertion and removal airlock opening in the chamber wall.

U.S. Pat. No. 3,915,117 discloses a vacuum coating apparatus for the vapor depositing of thin coatings on substrates, having an insertion chamber, additional chambers for the treatment and coating of the substrates, and an exit chamber provided with a conveying means disposed in an evacuable main chamber for carrying the substrates through the chambers, sealing means being provided for momentary sealing between the chambers and the main chamber. The conveying means having frames disposed about a common axis and swingable about this axis for holding the material that is to be coated, while in at least two treatment positions, namely an insertion and removal position and a vapor depositing position, such a frame itself forms a part of the wall of the treatment chamber, namely of the insertion and removal chamber and a vapor depositing chamber, and wherein a movable valve plate is provided in at least one of these treatment positions for shutting off one face of the frame forming a part of the treatment chamber.

Lastly, a vacuum coating apparatus is known (U.S. Pat. No. 3,838,028) in which, in addition to the cylindrical transport chamber for the circular disk-shaped rotatable substrate holder, a second chamber is provided for inserting and removing the substrates through an airlock, and is connected to the transport chamber through an opening.

The known vacuum coating apparatus all have the disadvantage that the application of masks to the substrates, intended to prevent the coating of the entire surface of the substrates, is possible only outside of the vacuum chamber and transport chamber. This, however, has the disadvantage especially that the masks for the partial covering of the substrates become unusable after just a few coating procedures, since after the coated substrates are removed through the exit airlock they come in contact with the oxygen of the air, resulting in a layer forming glitter on the surface of the mask.

SUMMARY OF THE INVENTION

The present invention is addressed to an apparatus of the above-described kind which will permit a reliable, fully automatic masking, especially of magneto-optical disks, the masking to provide an extremely precise and well-centered masking of the substrate within the vacuum chamber.

According to the invention a substrate carrier plate is mounted for rotation in each of the two transport chambers about axes of rotation at a distance from one another that at least in one position permits the superposition of two substrate receivers. In the area of such superposition a first plunger is disposed above the first substrate carrier and a second plunger below the other substrate carrier. Both carriers are longitudinally displaceable parallel to the axes. The first carrier holds a substrate which in turn is engaged by the mask, while the second carrier engages the mask with a magnet when it is transferred from the first carrier by the first plunger. After a coating operation in the second transport chamber, the second plunger releases the mask from the second carrier, moves it back to the first carrier where the substrate is peripherally engaged, then moves the mask still further in order to release it from the substrate. The second plunger then retreats, and the coated substrate can be rotated in the first chamber.

BRIEF DESCRIPTION OF THE DRAWING

The sole FIGURE is a partial longitudinal section through the apparatus.

DETAILED DESCRIPTION OF THE PREFERRED EMBODIMENT

The apparatus consists essentially of a pressure-tight housing 2 having two chambers 3 and 4 connected together by an opening 5, each of the two chambers 3 and 4 being configured as a cylindrical cavity, and the longitudinal axes of the two cylindrical chambers 3 and 4 being disposed parallel to one another but offset from one another. In first transport chamber 3 and in the adjacent second transport chamber 4, respective first and second carrier plates 6 and 7 are affixed by respective spring arms 21 and 22 to hubs 8 and 9 which are mounted on drive shafts 10 and 11 which can be driven by motors (not represented). While the carrier plates 7 are revolving in chamber 4 carrying the substrates 20 on a circular path from one treatment station to the next treatment station, the carrier plates 6 are shifting the substrates from an entry and exit airlock station (not shown) to the transfer station and back (from the transfer station to the entry and exit airlock station). In the area of the opening 5 which connects the two chambers 3 and 4 to one another, a pusher tube 12 is provided which is held and guided in a driver unit 13, and which permits movement of the pusher tube 12 in the directions A and B. In the drive unit 13 there is mounted a first plunger 14 which likewise can be moved by a motor in the directions A and B and is held in a blind bore 32 of mask 31 by magnet 33 on the end of the plunger, the long axis of the plunger 14 being in line with the central bore 16 of a ring magnet 17 when the transport plate 7 is in the position shown. Also aligned with the plunger 14 is a second plunger 18 which is mounted in a motor unit 19 which is disposed on the housing 2 opposite the drive unit 13, and which likewise permits movement of the plunger 18 in directions A and B. Note that a bore 34 is provided in mask 31 in order to permit gas transfer from the first transport chamber 3 to the second transfer chamber 4 when the first carrier 6 holds the substrate 20 while the mask 31 engages the substrate 20.

In the drawing, the positions of the transport plates 6 and 7 are represented such that the transfer of a substrate 20 from the carrier plate 6 to carrier plate 7 can take place. Such carrier plates and their drive units are further described in U.S. Pat. No. 4,943,363.

For the purpose of transferring the substrate 20 to the second carrier plate 7, the first carrier plate 6 is pushed in direction A, against the force of the spring arms 21, 21' by the pusher tube 12 out of a middle position indicated in broken lines to the inside wall 23, while at the same time the driving of shaft 10 is stopped. The first plunger 14 then moves in direction A leftward to the carrier plate 6 locked in the position shown, until the head 24 of the mask 31 enters into the central opening 25 of the substrate 20, and then onward, carrying with it the substrate 20, until the head 24 is in contact with the magnet 17 and held in this position by the latter in the bore 26. At this point annular flange 15 is in contact with the substrate, where it serves a masking function in a subsequent coating operation. To permit the substrate 20 to be carried from the position represented to the position on the carrier plate 7 indicated in broken lines, the jaws 27, 27' yield resiliently, releasing the substrate 20. The mask 31 is now centered in the bore 26 and held on magnet 17 such that the first plunger 14 can be moved back in direction B to its starting position, while at the same time the carrier plate 7 can be moved onward around the axis b in order to transport the substrate 20 to the first treatment station. As the turning movement of this second carrier plate 7 continues, an additional second carrier plate adjacent thereto is swung into the position in which the represented second carrier plate was previously, so that the substrate 20 which it is holding can be transferred to the first carrier plate stopped opposite it. For this purpose the second plunger 18, driven by motor 19, moves in direction B until its distal end comes in contact with the mask 31, pulls this mask from the magnet 17 on the transport plate 7, and then transports the mask 15, together with substrate 20, in direction B all the way into the plane of the jaws 27, 27'. Since the head 24 of each mask 15 is provided with detents 28, 28' the mask 31 is held on the substrate 20 by the detents until any further movement of the mask in direction B is prevented by the jaws 27, 27'. The mask is then released and moved onward by the plunger 18 until it is firmly seated on the opposite plunger 14 (as shown in the drawing). The second plunger 18 is then withdrawn to the left and the pusher tube 12 is withdrawn to the right so that the second first carrier 6 can be rotated in the first transport chamber 3.

I claim:

1. Apparatus for masking a substrate in a vacuum chamber, said substrate comprising a disk having a central hole, said apparatus comprising a vacuum chamber comprising interconnected first and second substrate transport chambers, a mask having a blind central bore and means for engaging said central hole of said substrate, a first plunger movable on a first linear path in said vacuum chamber, said first plunger having an end which is receivable in said blind bore as said plunger moves on said path, a first carrier located in said first transport chamber and being movable through said first transport chamber on a first circular path about a first axis which is parallel to said first linear path, said first linear path intersecting said first circular path, said first carrier having means for releasably holding said substrate peripherally.

a second carrier located in said second transport chamber and being movable through said second transport chamber on a second circular path about a second axis which is parallel to said first linear path, said first linear path intersecting said second circular path, said second carrier having means for engaging said mask while said mask engages said substrate, a second plunger movable toward said second carrier on a second linear path which is collinear to said first linear path, said second plunger having an end which cooperates with said means for engaging said mask to release said mask from said second carrier by moving said mask toward said first carrier as said second plunger moves on said second path, whereby, said mask may be moved on said first linear path through said first carrier so that said mask engages said substrate and releases it from said first carrier and so that said mask then engages said second carrier, whereupon said first plunger may be withdrawn so that said substrate with said mask engaged may be moved on said second circular path.

2. Apparatus as in claim 1 wherein said means for engaging said mask comprises magnetic means fixed to said second carrier, said mask being made of magnetic material.

3. Apparatus as in claim 1 wherein said means for engaging said central hole of said substrate comprises resiliently deformable detents.

4. Apparatus as in claim 1 wherein said mask comprises bore means therethrough to permit gas transfer from said first transfer chamber to said second transfer chamber when said first carrier holds said substrate while said mask engages said substrate.

5. Apparatus as in claim 1 wherein said first and second carriers are mounted on spring arms which permit said carriers to move on said first and second paths parallel to said first and second axes.

6. Apparatus as in claim 5 further comprising tubular pusher means which bears on said first carrier to move said first carrier toward said second carrier.

7. Apparatus as in claim 1 wherein said second carrier has a hole therethrough which permits said second plunger to bear directly against said mask.

8. Apparatus as in claim 1 wherein said end of said first plunger comprises a permanent magnet.

* * * * *